(12) United States Patent
Mantese et al.

(10) Patent No.: US 11,469,362 B2
(45) Date of Patent: Oct. 11, 2022

(54) COMPOSITE SUPERCONDUCTING MATERIALS AND PROCESSES FOR THE PRODUCTION THEREOF

(71) Applicant: Ferro Domain, LLC, Ellington, CT (US)

(72) Inventors: John J. Mantese, Ellington, CT (US); Joseph V. Mantese, Ellington, CT (US)

(73) Assignee: FERRO DOMAIN, LLC., Ellington, CT (US)

( * ) Notice: Subject to any disclaimer, the term of this patent is extended or adjusted under 35 U.S.C. 154(b) by 310 days.

(21) Appl. No.: 16/858,876

(22) Filed: Apr. 27, 2020

(65) Prior Publication Data

US 2021/0336120 A1  Oct. 28, 2021

(51) Int. Cl.
*H01L 39/12* (2006.01)
*H01L 39/24* (2006.01)

(52) U.S. Cl.
CPC ........ *H01L 39/125* (2013.01); *H01L 39/2403* (2013.01)

(58) Field of Classification Search
CPC .. H01L 39/125; H01L 39/2403; H01L 39/005
See application file for complete search history.

(56) References Cited

U.S. PATENT DOCUMENTS

2020/0028063 A1* 1/2020 Braeuninger-Weimer .................. H01L 39/126
2022/0148755 A1* 5/2022 Sousa Soares De Oliveira Braga .................... H01B 12/00

* cited by examiner

*Primary Examiner* — Matthew L Reames
(74) *Attorney, Agent, or Firm* — Hartman Global IP Law; Gary M. Hartman; Domenica N. S. Hartman

(57) ABSTRACT

Superconductors and processes that form superconductors as composites of electrically polarizable ferroelectric materials and electrically conductive materials. The materials are chosen such that the binding energy of charge carriers within the materials exceeds the repulsive energy of the carriers and the energy carried by thermal vibrations (phonons) within the materials.

25 Claims, 8 Drawing Sheets

COMPOSITE SUPERCONDUCTING MATERIALS AND PROCESSES FOR THE PRODUCTION THEREOF

BACKGROUND

The present invention generally relates to superconducting materials and processes for their production. The invention particularly relates to composite superconducting materials that exhibit a cooperative phenomenon between coupled charge carriers confined within an electrically conductive material interfaced with one or more regions of an electrically polarizable ferroelectric material.

Superconductivity is a naturally occurring phenomenon manifested by near zero electrical resistance and the occurrence of spontaneous diamagnetism below a critical transition temperature, $T_c$.

Superconductors have a number of practical applications, including but not limited to: the carrying of current without resistive losses, high sensitivity magnetometers, quantum sensing, and as the logic elements, qubits, in quantum computing systems.

Superconductors with critical transitions above liquid nitrogen temperature (LNT, 77K) are of special interest as they then can be used with liquid based cooling, greatly simplifying their implementation as devices, their packaging and their maintenance. Materials with 77K superconducting transitions or above are of particular interest as they provide the critical elements for newer classes of quantum inspired sensors and devices that can be used with either liquid nitrogen or thermoelectric based cooling.

BRIEF DESCRIPTION

The present application discloses superconducting materials and processes for production manifested as composites of electrically conductive and ferroelectric materials.

According to one aspect of the invention, a composite superconducting material includes a first electrically polarizable ferroelectric material having an electrical polarization, a first electrically conductive material interfacing with the first electrically polarizable ferroelectric material, and coupled charge carriers confined within the first electrically conductive material and adjacent to the first electrically polarizable ferroelectric material. The first electrically polarizable ferroelectric material is not required to have the same electrical polarization throughout, and may comprise or consist of a single crystal of uniform polarization, multiple electrically polarizable domains, or even individual ferroelectric unit cells.

According to another aspect of the invention, a method of producing a superconducting material includes combining a first electrically conductive material and a first electrically polarizable ferroelectric material by powder mixing, melt forming, sputtering, atomic layer deposition, physical vapor deposition, electroplating, chemical vapor deposition, or co-sintering, to yield a layered or mixture composite structure.

Technical aspects of materials and processes having features as described above preferably include the ability to produce superconducting materials that utilize the electrical polarizability nature of some materials to evoke a superconducting state within electrically conductive materials below or above LNT and even approaching room temperature.

Other aspects and advantages of this invention will be appreciated from the following detailed description.

DETAILED DESCRIPTION

A detailed description of nonlimiting embodiments of composite superconducting materials and processes for their production are presented herein by way of exemplification with reference to the drawings.

Superconducting materials (superconductors) are described below that are formed as composites of ferroelectric and electrically conductive materials. Charge coupling spontaneously arises within the electrically conductive material as a result of ferroelectric polarization, and coupled charge carriers are confined in two-dimensional (2D) regions of the electrically conductive material adjacent to electrically polar regions of the ferroelectric material. Electrons are attracted to positive regions of electrical polarization in the ferroelectric material, while holes are attracted to negative regions of electrical polarization in the ferroelectric material. The ferroelectric material may have the same (uniform) polarization throughout (e.g., as a ferroelectric single crystal thin film or bulk ceramic substrate that spans across the entire structure shown in FIG. 3B), or its electrical polarization may be relegated to one or more regions (domains) as small as a single ferroelectric unit cell. The charge carrier density in the electrically conductive material may be adjusted so that the number of charge carriers present can support a superconducting current, but are also sufficiently sparse so that the Debye screening length ($L_D$) within the electrically conductive material is larger than either the thickness of the electrically conductive material. The superconducting state is achieved in these composites when the absolute magnitude of the binding energy of a pair of charge carriers to the polarization charge exceeds the repulsive energy between the charge carriers and the average kinetic energy of the carrier pairs (as characterized by $3 k_B T$, where $k_B$ is the Boltzmann constant, $1.38064852 \times 10^{-23}$ m² kg s⁻² K⁻¹, and T is the temperature in Kelvin. Superconducting temperatures exceeding liquid nitrogen temperature (77K) are thus possible.

Figure 1:
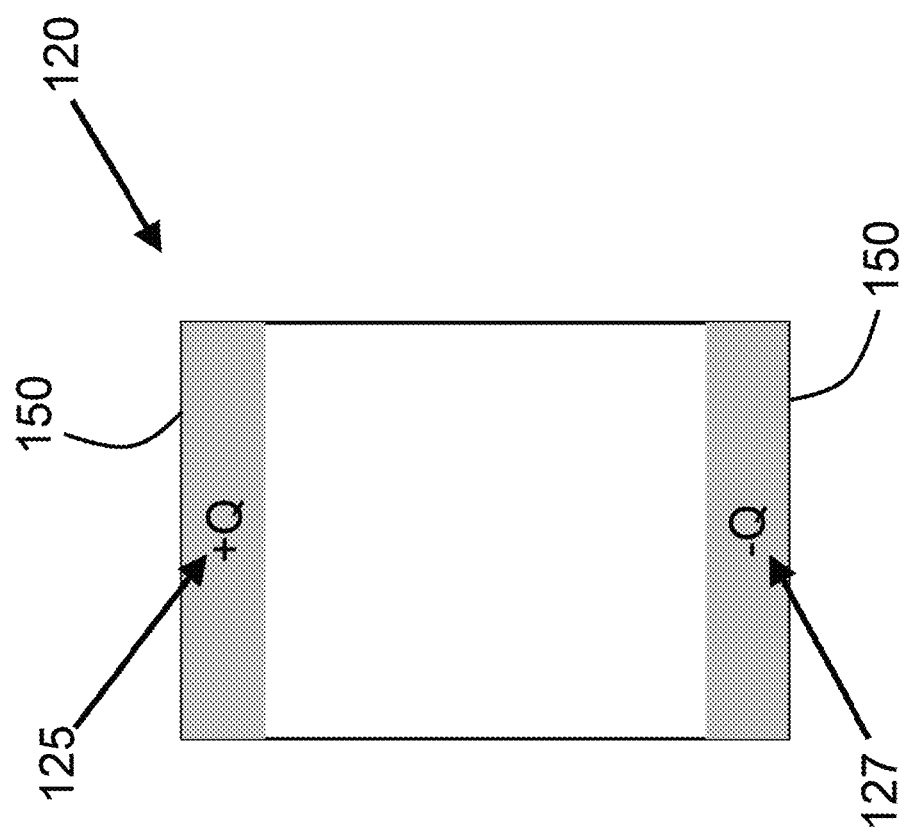
FIG. 1 is a schematic depiction of a polarized ferroelectric material with electrically polarized surfaces.

FIG. 1 schematically represents an electrically polarizable ferroelectric element 120 in which positive and negative polarization charges 125 and 127 are present at oppositely-disposed surfaces 150 of the element 120. The charges 125 and 127 arise spontaneously as the lowest energy state of the ferroelectric material of the element 120. The spontaneous polarization ($P_s$) is a measure of the charge density spontaneously arising on the surfaces 150. Without loss of generality the positive and negative charges 125 and 127 may be interchanged. The ferroelectric element 120 must be a non-centrosymmetric electrically polarizable ferroelectric material, as nonlimiting examples, lithium niobate ($LiNbO_3$), lithium tantalate ($LiTaO_3$), lead zirconate titanate ($Pb[Zr_x Ti_{1-x}]O_3$ ($0 \leq x \leq 1$)), their alloys, and fluoropolymers. Because lower polarizability corresponds to a lower critical transition temperature, Tc, it is preferable for the spontaneous polarization ($P_s$) of the ferroelectric material to be at least 0.1 µC/cm², more preferably at least 1 µC/cm², and most preferably greater than 10 µC/cm² to achieve the highest superconducting transition temperatures. However, the invention is not limited to ferroelectric materials with Tc> or =77K, but in general superior superconducting material can be obtained with higher polarization values.

The polarized ferroelectric element 120 schematically depicted in FIG. 1 can represent, as nonlimiting examples: a bulk single crystal material, a series of ferroelectric domains of given polarization, or in the limit a single molecule of the material. Various regions of the ferroelectric element 120 are characterized by a single direction of electric polarization, however, the orientation, direction, and magnitude of the ferroelectric polarization can vary within and across the ferroelectric material.

To prevent charge screening in the electrically conductive material, it is desirable for the charge carrier density (n) to be small enough such that the Debye screening length, $$L_D = \sqrt{\frac{\epsilon k_B T}{e^2 n}},$$

is greater than the two-dimensional (2D) thickness (t) of the electrically conductive material. The dielectric permittivity ($\epsilon$) is that of the electrically conductive material. Consequently, the choice of electrically conductive material and its thickness are preferably selected such that $t < L_D$. An optimal design for a composite is then a layered structure comprising one or more layers of electrically conductive materials having thicknesses of less than $L_D$ and interposed between layers of oppositely-poled single-domain ferroelectric materials. Such a configuration allows for a maximum number of superconducting transport planes in the direction of current flow, similar to what is naturally achieved in perovskite based high $T_c$ metal oxide based superconductors by self-assembly.

The electrically conductive material may be a semiconductor material, a semi-metal, or a metal. The electric resistivity of the electrically conductive material is related to the number of charge carriers. A sufficiently high charge carrier density (n) in the denominator of the above equation for the Debye screening length, $L_D$, will result in the criteria $t < L_D$ being unsatisfied. On the other hand, for excessively large resistivity values there will not be enough charge carriers in the electrically conductive material to form pairs. On this basis, it is believed that suitable electrically conductive materials are semiconductor materials, semi-metals, and metals with conductivities ranging from about $10^{-6}$ $\Omega^{-1}$-cm⁻¹ to about $10^6$ $\Omega^{-1}$-cm⁻¹, more preferably from about $10^{-5}$ $\Omega^{-1}$-cm⁻¹ to about $10^5$ $\Omega^{-1}$-cm⁻¹, and most preferably from about $10^{-4}$ $\Omega^{-1}$-cm⁻¹ to about $10^4$ $\Omega^{-1}$-cm⁻¹.

Figure 2:
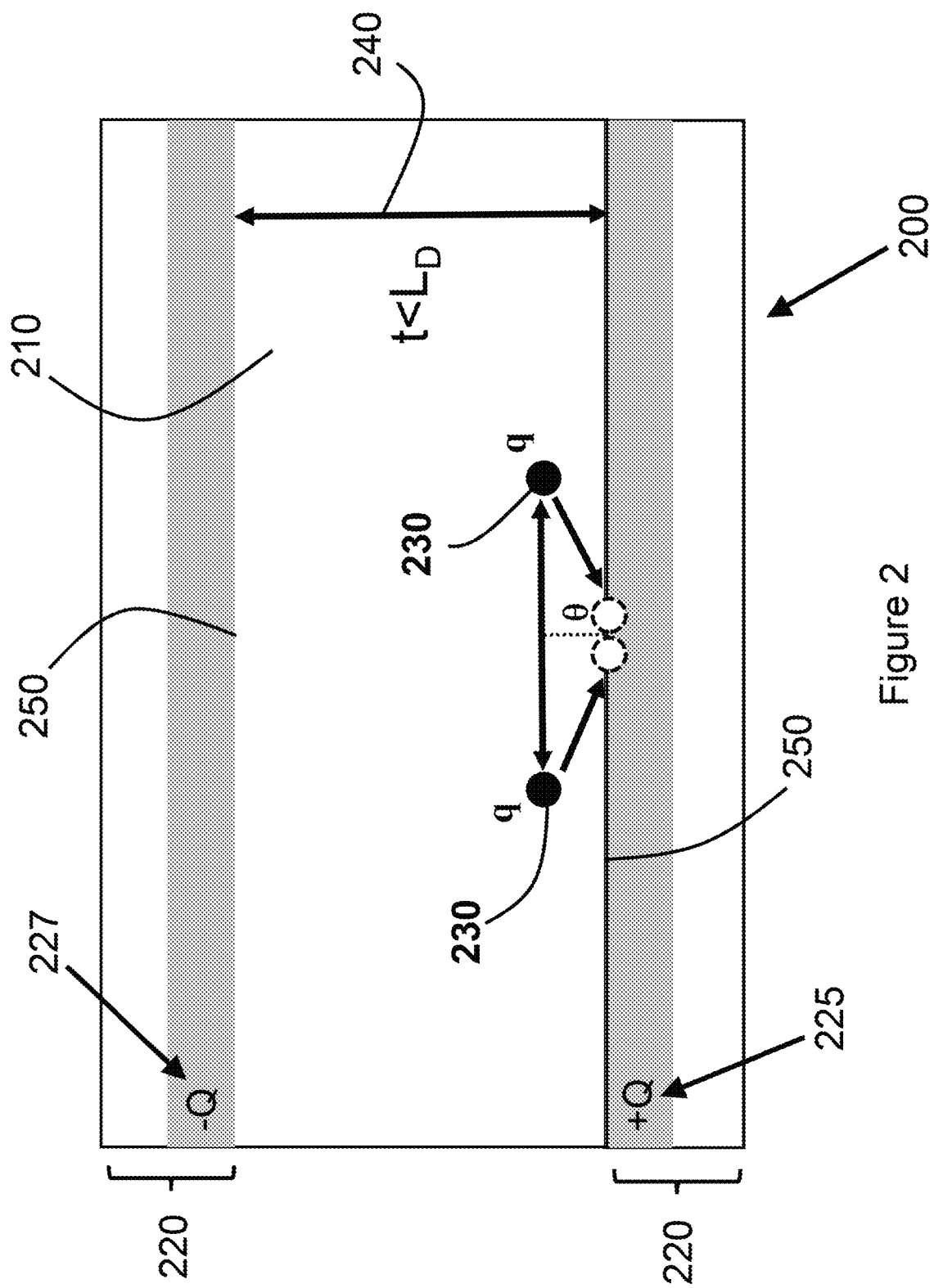
FIG. 2 schematically represents a superconducting material formed as a composite comprising ferroelectric and electrically conductive materials, and depicts forces of attraction within the materials that bind electrical charge carriers within the electrically conductive material to a bound electrically polarized charge of the ferroelectric material.

FIG. 2 schematically represents a ferroelectric-conductor composite 200 comprising a conductor layer 210 of an electrically conductive material sandwiched between two ferroelectric layers 220 of a ferroelectric material. Positive and negative polarization charges spontaneously arise at surfaces 250 of the ferroelectric layers 220 interfacing with the conductor layer 210 to create positive and negative surface charge densities 225 and 227. Charge carriers 230 (q), either electrons or holes, are attracted to the surface charge densities 225 and 227. Without loss of generality, the positive and negative surface charge densities 225 and 227 may be interchanged, and the electrons 230 may be replaced with holes. In FIG. 2, the depicted charge carriers 230 are two electrons that are attracted to the positive surface charge density 225 and form a bound pair. The thickness 240 (t) of the conductor layer 210 is indicated as preferentially being less than the Debye electrical screening length ($L_D$).

The ferroelectric-conductor composite 200 represented in FIG. 2 as well as other composites described herein may be formed by various methodologies, including but not limited to powder mixtures, mechanical alloying, physical layer deposition, atomic layer deposition, sputtering, sintering, chemical vapor deposition, and electrochemical deposition. In the nonlimiting embodiment represented in FIG. 2, the composite 200 is in the form of a layered structure comprising layers of a ferroelectric material and a layer of an electrically conductive material. In other embodiments, composites may be a mixture of an electrically conductive material in a matrix of a ferroelectric material, or a ferroelectric material in a matrix of an electrically conductive material, for example, filaments or inclusions of a ferroelectric material embedded and distributed in an electrically conductive matrix as represented in FIGS. 3A and 3C, respectively.

Figure 3A:
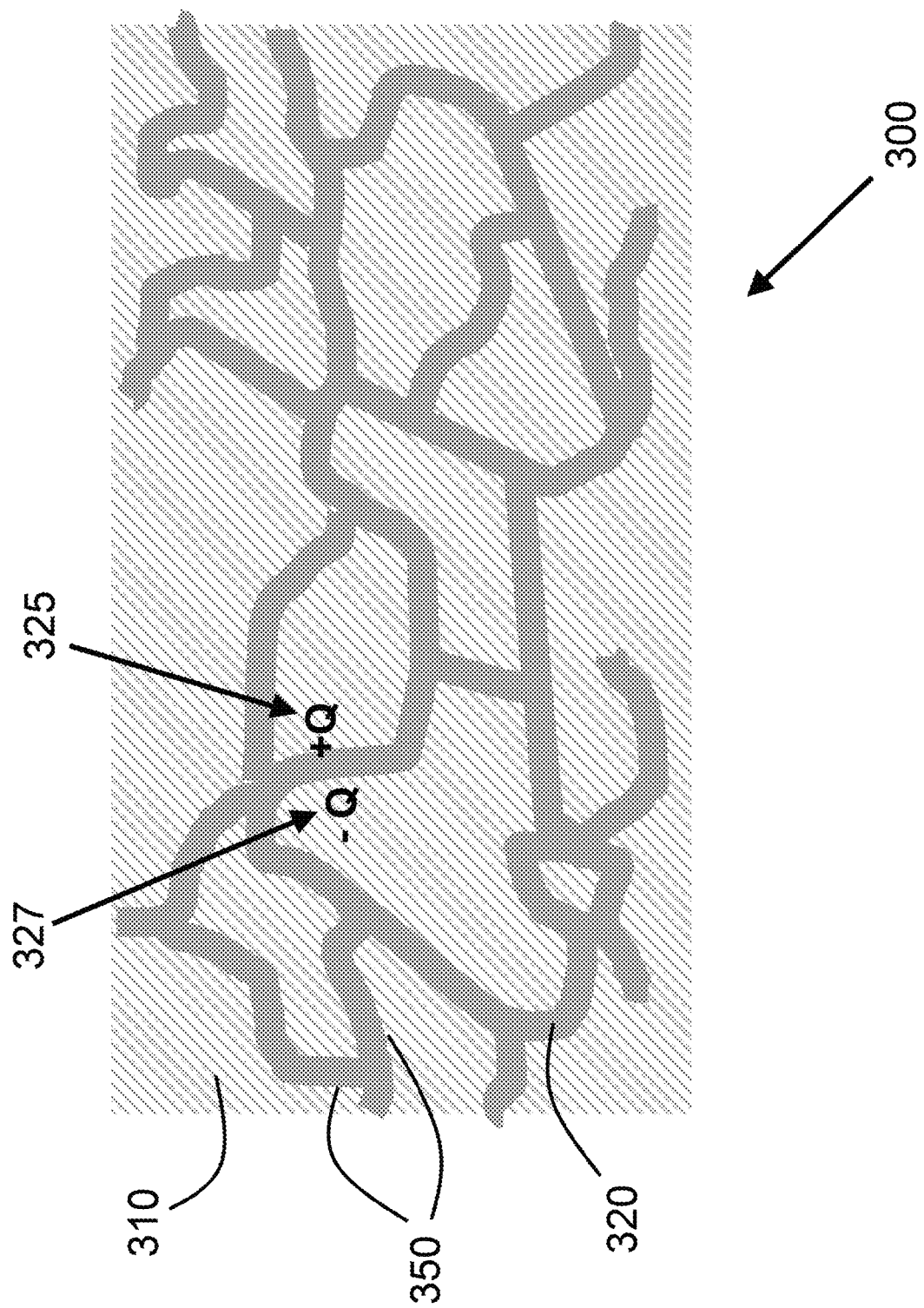
FIG. 3A schematically represents a first nonlimiting embodiment of a superconducting material formed as a composite comprising filaments of a polarized ferroelectric material embedded and distributed in a matrix of an electrically conductive material.

FIG. 3A schematically represents a ferroelectric-conductor composite 300 comprising filaments 320 of a ferroelectric material embedded and distributed in a conductor matrix 310 of an electrically conductive material. Each ferroelectric filament 320 creates positive surface charge densities 325 and negative surface charge densities 327 at its interfaces 350 with the conductor matrix 310. Without loss of generality, the positive and negative surface charge densities 325 and 327 may be interchanged. Furthermore, a ferroelectric material could form the matrix 310 of the composite 300 and contain filaments 320 of an electrically conductive material. Whether in the form of the matrix 310 or filaments 320, the electrically conductive material is preferred to be such that t<$L_D$ normal to the ferroelectric polarizable surface so as to satisfy the local condition for screening.

Figure 3B:
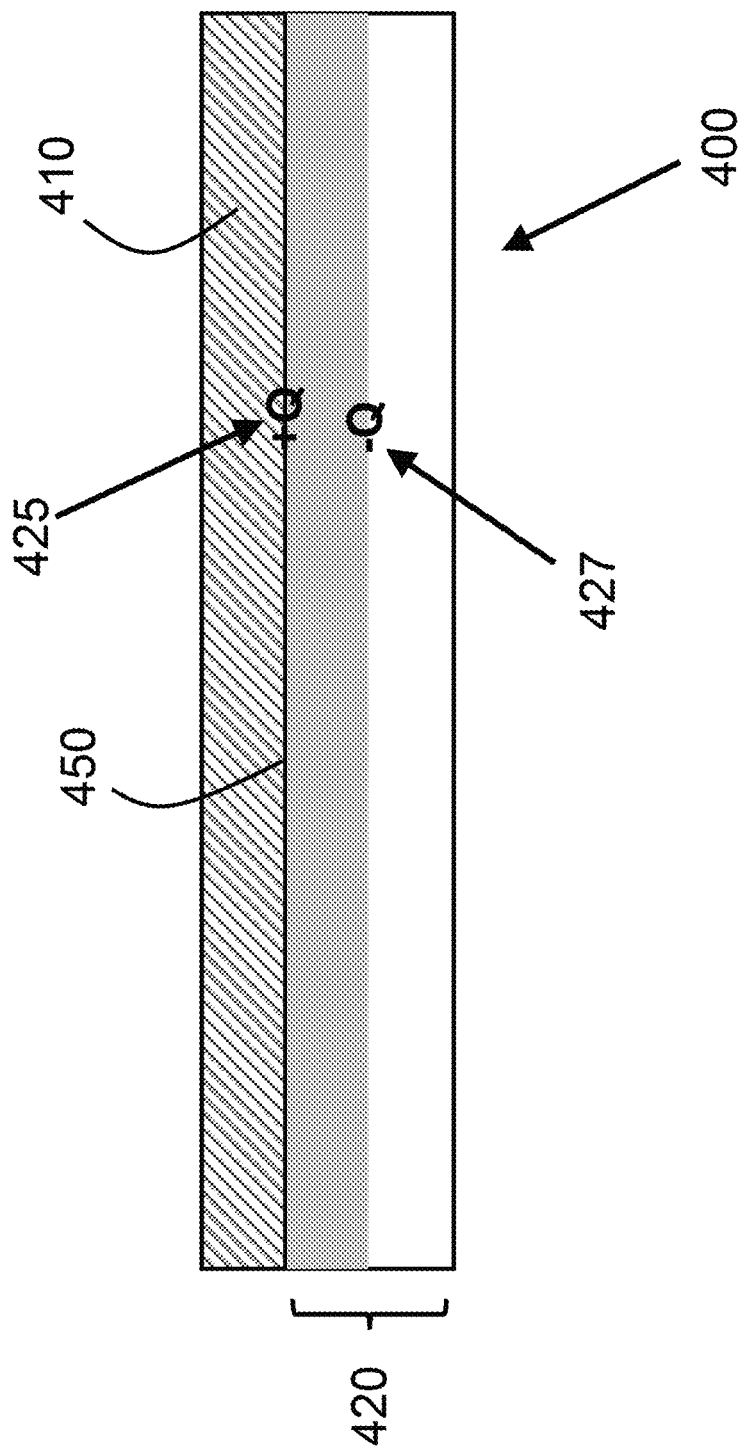
FIG. 3B schematically represents a second nonlimiting embodiment of a superconducting material formed as a composite material comprising layers of an electrically conductive material overlaid and in contact with an electrically polarized ferroelectric material.

FIG. 3B schematically represents a ferroelectric-conductor composite 400 comprising a conductive layer 410 of an electrically conductive material on a ferroelectric layer 420 of a ferroelectric material. The ferroelectric layer 420 creates a positive surface charge density 425 and a negative surface charge density 427 at its interface 450 with the conductive layer 410. Without loss of generality, the positive and negative surface charge densities 425 and 427 may be interchanged, and the conductive and ferroelectric layers 410 and 420 may be interchanged. Without loss of generality, the composite 400 may represent a portion of the material, a domain, or even a single ferroelectric unit cell. The electrically conductive layer 410 is preferred to be of a thickness less than $L_D$.

Figure 3C:
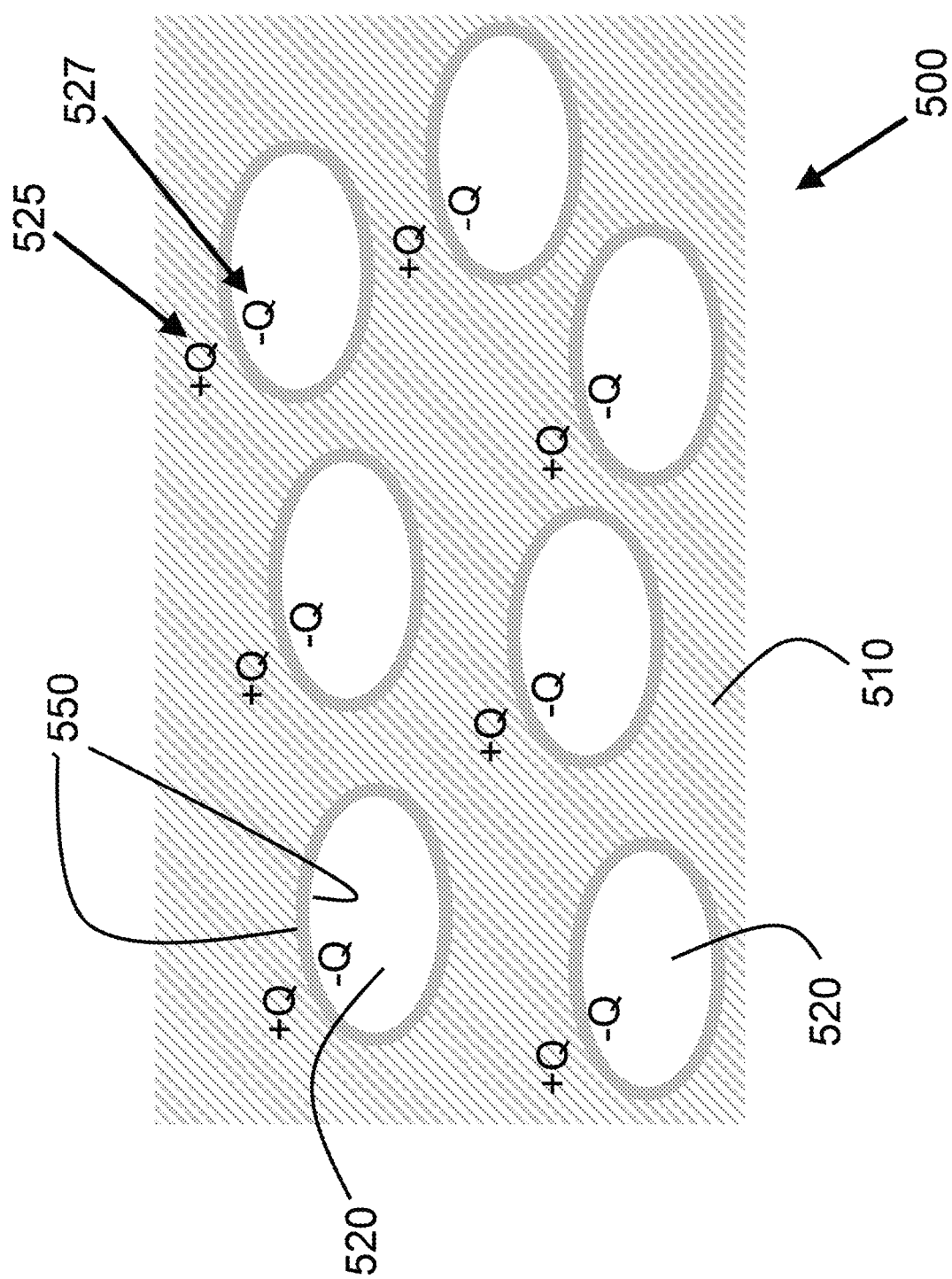
FIG. 3C schematically represents a third nonlimiting embodiment of a superconducting material formed as a composite comprising inclusions of an electrically polarized ferroelectric material embedded and distributed in a matrix of an electrically conductive material.

FIG. 3C schematically represents a ferroelectric-conductor composite 500 comprising a conductive matrix 510 of an electrically conductive material and ferroelectric inclusions 520 of a ferroelectric material embedded and distributed in the conductive matrix 510. Each ferroelectric inclusion 520 creates a positive surface charge density 525 and negative surface charge density 527 at its interface 550 with the conductive matrix 510. Without loss of generality, the positive and negative surface charge densities 525 and 527 may be interchanged, and the conductive matrix 510 and ferroelectric inclusions 520 may be interchanged. Whether in the form of the matrix 510 or inclusions 520, it is preferred that the electrically conductive material has a thickness normal to the electrically polarized layer of less than $L_D$.

The following describes investigations relating to the formation of a Bose condensate in a semiconductor layer (as an electrically conductive material) interposed between two layers of a ferroelectric material. For suitably doped electrically conductive materials, charge coupling is shown to spontaneously arise along each face of the ferroelectric material, creating the necessary coupling potential to establish the Bose condensate. To make this transition possible, the ferroelectric bound charge must be sufficiently large to overcome the repulsive forces of the like carriers, the 2D carrier density within the electrically conductive material should preferentially be not so large as to screen the ferroelectric electric dipoles along the conduction path, the temperature must be below the dielectric to ferroelectric (Curie) transition, and there must be relatively few phonons of sufficient energy to induce breakage of the coupled carriers.

A description of a superconducting state often begins by writing an expression for the spatially symmetric wave function, $\psi((|r_2-r_1|)$, with a potential $U(|r_2-r_1|)$ that describes the interaction between two charge carriers as:

$$\frac{-\hbar^2}{2m}(\nabla_1^2 + \nabla_2^2)\psi + U(|r_2 - r_1|)(\psi) = E\psi \quad (1)$$

Here, E, is an energy eigenvalue, and $|r_2-r_1|$ denotes the fact that the interaction potential is only a function of the inter-carrier distance. In this construct, it is assumed the carriers have opposite spin so that the wave function is not only antisymmetric but yields an inherently lower exchange potential due to anti-spin alignment. The spatial portion of the potential must be attractive to ensure coupling between the carriers and represents the collective (mesoscopic) response of the extended system. Thus, the key to creating a new superconducting system reduces to one of exploiting a new form of like-carrier-carrier-coupling potential that remains robust below temperatures where phonon-carrier absorption ceases to cause carrier-carrier de-coupling.

The potential energy, U, of the charge configuration can be written in terms of q (the carrier charge; −e for unscreened electrons, +e for unscreened holes), Q (the combined ferroelectric dipole and ionic charges), the angle (θ) between each of the two charges and the combined ionic and ferroelectric charge, and the distance (d) of the charge normal to Q. For q=−e:

$$U = \left(-\frac{e^2 \cos\theta}{8\pi\varepsilon_0 \kappa d}\right) \cdot \left(\frac{4Q}{e} - \frac{1}{\sin\theta}\right) \quad (2)$$

Here, $\varepsilon_0$ is the permittivity of free space and κ is the relative permittivity which is approximated as that of the ferroelectric material (assuming that the ferroelectric permittivity is much larger than that of the semiconductor, with the majority of the electric field contained in the ferroelectric material). The distance, d, of the charge normal to Q is approximated as half the length of the long axis of the ferroelectric tetragonal unit cell, i.e., d is about c/2. Likewise, the polarization charge is approximated as a point charge, Q≈$a^2 P_s$, with $a^2$ the base area of the ferroelectric unit cell (assumed to be tetragonal), and $P_s$ the spontaneous polarization of the ferroelectric. The coupling potential (U) can result in a net attractive force that depends upon the magnitude of the spatial carrier separation as required by Equ. 1.

The free charges remain "coupled" as long as the kinetic energy of the two charge carriers is less than the binding energy, i.e., $|U_{min}|>2(3\ k_B T/2)|$; where $k_B$ is Boltzmann's constant and T is the absolute temperature in Kelvin. $U_{min}$ can be determined directly from Equ. 2 from the requirement that dU/dθ=0 at minimum, to yield:

$$\sin^3\theta = \left(\frac{1}{\gamma}\right) \quad (3)$$

$$U_{min} = -U_0\left(\gamma - \gamma^{\frac{1}{3}}\right)\sqrt{1 - (1/\gamma)^{2/3}} \quad (4)$$

Here, γ=(4Q/q) and $$U_0 = \frac{q^2}{8\pi\kappa\varepsilon_0 d}.$$

One can thus estimate a superconducting transition temperature, by assuming that each charge carrier has 3 $k_B T/2$ kinetic energy, and thus, $T_c$ is about $U_{min}/(3\ k_B)$, with $U_{min}$ the minimum of the potential from above. In addition, the presence of lattice vibrations within the semiconductor and ferroelectrics will require further reductions in temperature to prevent decoupling of the charge carriers. From Equ. 4, high superconducting transition composites are favored for ferroelectric materials with high spontaneous polarization and minimal dielectric constant, notable but nonlimiting examples of which include lithium niobate and tantalum niobate.

For lithium niobate with a Curie temperature of about 1450K, c=1.386 nm, a=0.515 nm, κ is about 45, and $P_s$ is about 70 μC/cm². It thus follows from the quasi-static analysis above that $T_c$ is about 210K at the energy minimum, providing the number of free carriers is sufficiently light so as not to screen the ferroelectric charge. The estimated critical temperature exceeds even that found for mercury and thallium based high $T_c$ superconducting materials.

To prevent charge screening in the semiconductor, it is preferential for the carrier density (n) to be small enough such that the Debye screening length ($L_D$) is greater than the 2D thickness (t) of the layer of electrically conductive material (in this case, a semiconductor), i.e., $t<L_D$ (FIG. 2). The optimal design for a composite having a layered structure is where the electrically conductive layer(s) is less than $L_D$ and is interposed between oppositely-poled single domain ferroelectric layers. As noted above, such a configuration allows for the maximum number of superconducting transport planes in the direction of current flow, similar to what is naturally achieved in perovskite-based high $T_c$ metal oxide-based superconductors by self-assembly.

For a composite formed by powder mixing, t may be about 1 to 10 μm through random mixing at modest volumetric fill fractions of the electrically conductive material relative to the ferroelectric material. For a semiconductor, the conductivity is related to the charge density (n) and the mobility (μ) by the relation σ=neμ, with the charge density given by, $$n = n_0 \exp\left(-\frac{E_g}{2k_B T}\right),$$

with $E_g$ the gap energy. Thus, $$L_D = \sqrt{\frac{\epsilon k_B T}{e^2 n}} = \sqrt{\frac{\epsilon k_B T}{e^2 n_0}} \exp\left(\frac{E_g}{4k_B T}\right) \quad (5)$$

Consequently, for a semiconductor with suitable bandgap, lowering the temperature of a composite or layered structure of a ferroelectric-semiconductor-ferroelectric composite material creates the ability to sweep through orders of magnitude changes in the screening lengths so as to satisfy the Debye condition in the composite.

As the temperature of the semiconductor component of a ferroelectric-semiconductor-ferroelectric composite decreases, the number of charge carriers, $N_D$, in a "Debye cell" (defined by the volume, $V_D=a^2 L_D$, with $a^2$ the ferroelectric unit cell area defined above) rapidly diminishes (dependent upon the value of $E_g$), and is equal to:

$$N_D = a^2 L_D n = a^2 \sqrt{\frac{\epsilon k_B T n_0}{e^2}} \exp\left(-\frac{E_g}{4k_B T}\right) \quad (6)$$

When $N_D \ll 2$, the material no longer has sufficient charge carriers within the volume defined by the Debye cell to sustain paired carriers. This does not mean, however, that superconductivity is extinguished, but only that the ability to support large current densities has. Moreover, in composites of ferroelectric and semiconductor formed randomly with a distribution of semiconductor thicknesses, there are likely to be both normal and superconducting regions.

Consequently, in a random composite of ferroelectric and semiconductor, there may be observed an initial rapid decrease in electrical resistance as the temperature is lowered below the superconducting transition temperature. Here stable Cooper pairs form as the phonon energy and density are reduced below $U_{min}$. Furthermore, at some still lower temperature the resistivity may begin to rise as the number of charge carriers in a Debye cell diminish below a value insufficient to provide adequate numbers of Cooper pairs to support a super-current.

In investigations leading to the present invention, various volumetric mixtures of a LiNbO$_3$ (LNB) and Ti$_x$O$_y$ (TiO) powders (<40 μm) were combined together by powder mixing. Metal oxide semiconductors were preferred for the investigations over traditionally doped materials such as Si so as not to have a native oxide with a large bandgap interposed between the ferroelectric and semiconductor materials. TiO materials were chosen as the working semiconductor materials because they are known to exhibit properties ranging from metallic to semiconductor; and even in some cases to undergo rapid transitions to insulators at temperatures above 77K.

Each of the volumetric powder fractions was formed by dry mixing, screen sifting, then tamping each of the composites into individual polymeric housings fitted with separate current and voltage leads as a linear array. The inner electrode distance was about 0.9 cm with a cross-sectional area of about 0.48 cm². Specimens of various volume fractions of TiO:LNB were driven with a constant current (dc) source and the voltage drop was measured across the inner leads as a four-probe resistive arrangement. To ensure that local heating did not substantially impact the specimen resistance measurements, the current through the specimens was varied from 10 μA to 1 mA to note any resistance variation with current density. The direction of the current was reversed for all the measurements to ensure that ferroelectric induced voltages arising from temperature changes were not a source of error in determining the composite net resistance.

Figure 4:
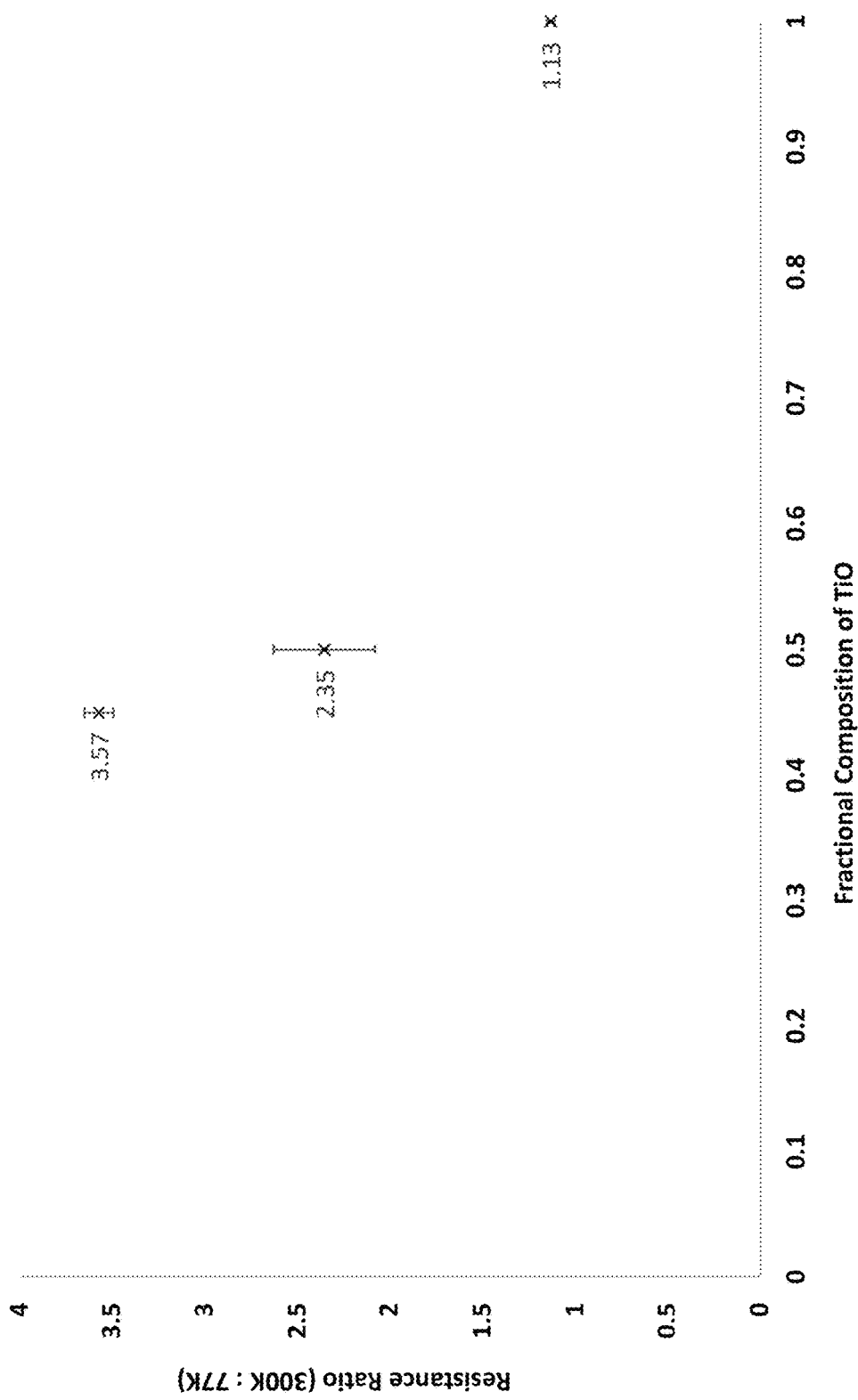
FIG. 4 is a graph plotting the ratio of resistance at 300K to that at 77K for composite materials containing various volume fractions of TiO:LNB.

FIG. 4 plots the temperature ratio, RT (about 300K) to LNT (about 77K), of the resistance for 100%, 50%, and 45% by volume specimens of TiO:LNB. The resistance of 100% TiO specimen remained essentially unchanged as a result of cooling from 300K to 77K, whereas the 45% and 50% TiO specimens first rapidly decreased in resistance then rose to values at 77K approximately 2-3× lower than their room temperature values, consistent with the above analysis.

It was not surprising that the magnitude of the resistance changed (dropped) with decreasing TiO volume content; for it is more likely that the material conforms to the Debye criteria ($t<L_D$) on an extended basis as the volume fraction of the semiconductor is diminished. However, a layered structure formed by physical vapor deposition or other systematic means of composite deposition process may allow formation of structures more closely aligned to the geometry of FIG. 2.

Figure 5:
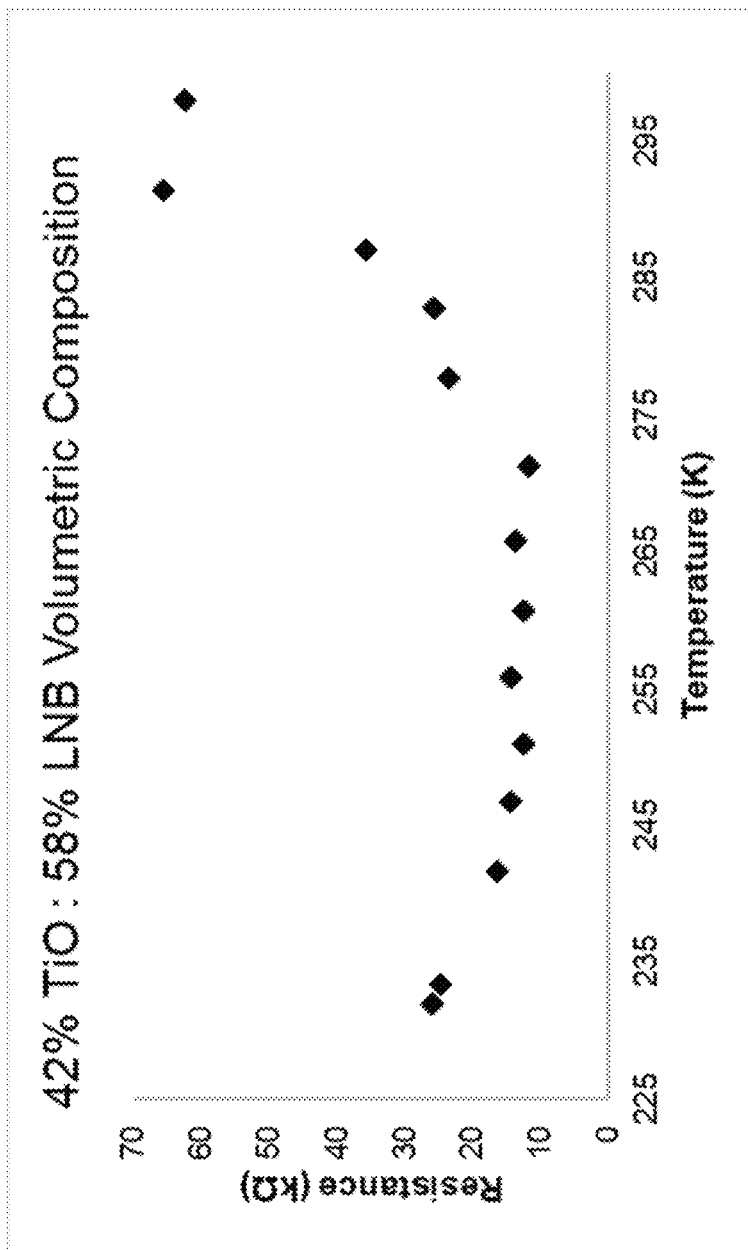
FIG. 5 is a graph plotting electrical resistance data for a composite TiO:LNB material over a temperature range that is above liquid nitrogen temperature (77K) and includes room temperature (300K).

For sufficiently thin semiconductor materials (i.e., $t<L_D$), a ferroelectric-semiconductor-ferroelectric sandwich structure would not be required. Instead, in cases where the semiconductor thickness is much less than the Debye screening length (e.g. a thin film of semiconductor deposited upon a ferroelectric substrate), a two-layer material (e.g., FIG. 3B) should suffice to achieve the same effect as the sandwich structure. By selective deposition of the semiconductor such that $t \ll L_D$, superconducting transition temperatures above 200K may be possible. Thus, it is intriguing in FIG. 5 to see that experimentally the resistance of a 42% TiO:58% LNB specimen was always found to reach a minimum value during cool down at a temperature significantly higher than that found at 77K. The upturn in the resistance versus temperature plot can thus be explained as a loss of carriers as the temperature of the specimen was cooled to where the number of carriers rapidly decreased.

Figure 6:
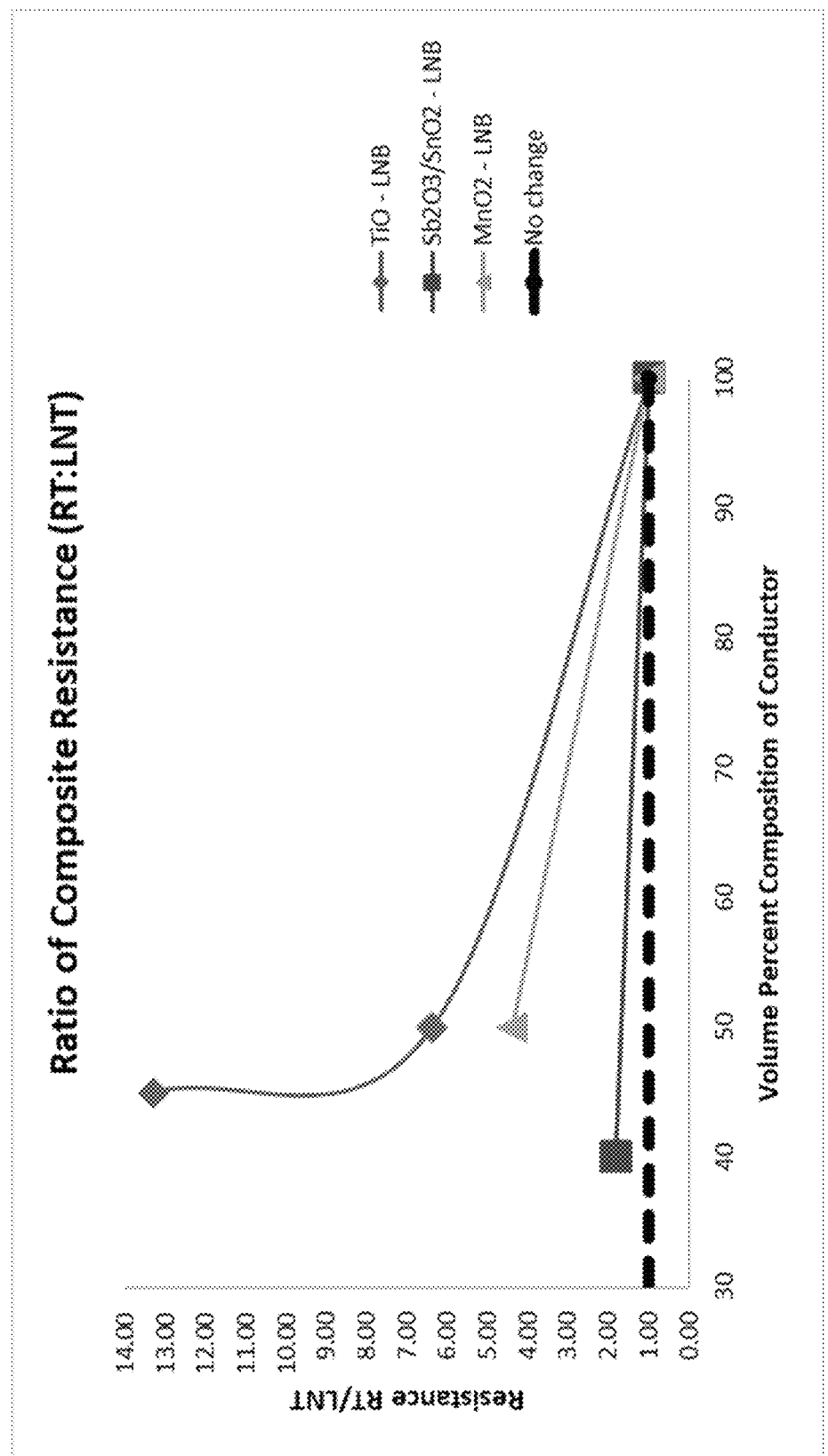
FIG. 6 is a graph containing data sets for various electrically conductive materials formed as powder composites with lithium niobate, plotted as the ratio of the electrical resistances of composite ferroelectric-conductor materials measured at room temperature (RT) to the electrical resistances thereof at liquid nitrogen temperature (LNT).

Additional experiments were conducted with other metal oxide semiconductor-lithium niobate composites. FIG. 6 is a graph containing data sets for these conductor-ferroelectric composites measured for electrical resistance at both room temperature (RT, about 300K) and liquid nitrogen temperature (LNT, 77K). The ordinate indicates the ratio of composite resistance at RT compared to LNT, with composite values normalized with respect to the resistance of each species of pure conductor. The abscissa represents the volume fraction of pure conductor species in each composite specimen, with values ranging from 35% to 50%. The balance of each composite was lithium niobite (LNB) ferroelectric. The constant slope "no change" line indicates a hypothetical specimen composition whereby the normalized RT resistance value is in exact proportion to the normalized LNT resistance value. Data points below the line indicate compositions with resistance response expected in a conductor-insulator mixture, and do not provide evidence of a superconducting transition. Data points above the line provide evidence of a potential cooperative phenomenon, with data points located farther up the ordinate more strongly suggestive of a superconducting phase transition.

While the invention has been described in terms of particular embodiments and investigations, it should be apparent that alternatives could be adopted by one skilled in the art. For example, superconducting materials and devices and their components could differ in appearance and construction from the embodiments described herein and shown in the drawings, process parameters could be modified, and appropriate materials could be substituted for those noted. As such, it should be understood that the above detailed description is intended to describe the particular embodiments represented in the drawings and certain but not necessarily all features and aspects thereof, and to identify certain but not necessarily all alternatives to the represented embodiments and described features and aspects. As a nonlimiting example, the invention encompasses additional or alternative embodiments in which one or more features or aspects of a particular embodiment could be eliminated or two or more features or aspects of different embodiments could be combined. Accordingly, it should be understood that the invention is not necessarily limited to any embodiment described herein or illustrated in the drawings, and the phraseology and terminology employed above are for the purpose of describing the disclosed embodiments and investigations and do not necessarily serve as limitations to the scope of the invention. Therefore, the scope of the invention is to be limited only by the following claims.

What is claimed is:

1. A composite superconducting material comprising:
   a first electrically polarizable ferroelectric material having an electrical polarization;
   a first electrically conductive material interfacing with the first electrically polarizable ferroelectric material; and
   coupled charge carriers confined between the first electrically conductive material and the first electrically polarizable ferroelectric material.

2. The composite superconducting material of claim 1, wherein the binding energy between the charge carriers exceeds the repulsive energy between the charge carriers and the average phonon (thermal vibration) energy of the first electrically conductive material and the first electrically polarizable ferroelectric material.

3. The composite superconducting material of claim 1, wherein the electrical polarization of the ferroelectric material is the same throughout the ferroelectric material, or is relegated to one or more regions (domains) as small as a single ferroelectric unit cell.

4. The composite superconducting material of claim 1, wherein the composite superconducting material comprises at least one layer formed of the first electrically conductive material contacting at least one layer of the first electrically polarizable ferroelectric material.

5. The composite superconducting material of claim 1, wherein the composite superconducting material comprises at least one layer formed of the first electrically conductive material between and contacting at least two layers of the first electrically polarizable ferroelectric material.

6. The composite superconducting material of claim 1, wherein the composite superconducting material is a mixture of the first electrically conductive material and the first electrically polarizable ferroelectric material.

7. The composite superconducting material of claim 6, wherein filaments of the first electrically polarizable ferroelectric material are distributed and embedded in a matrix of the first electrically conductive material.

8. The composite superconducting material of claim 6, wherein inclusions of the first electrically polarizable ferroelectric material are distributed and embedded in a matrix of the first electrically conductive material.

9. The composite superconducting material of claim 1, wherein the first electrically polarizable ferroelectric material has an electric surface charge density of at least 0.1 $\mu C/cm^2$.

10. The composite superconducting material of claim 1, wherein the first electrically polarizable ferroelectric material has an electric surface charge density of at least 1 $\mu C/cm^2$.

11. The composite superconducting material of claim 1, wherein the first electrically polarizable ferroelectric material has an electric surface charge density of greater than 10 $\mu C/cm^2$.

12. The composite superconducting material of claim 1, wherein the first electrically polarizable ferroelectric material is one or more of lithium niobate, lithium tantalate, or alloys of lead zirconate titanate.

13. The composite superconducting material of claim 1, wherein the first electrically conducting material is a metal, semiconductor, or semi-metal.

14. The composite superconducting material of claim 1, wherein the first electrically conducting material has a conductivity of about $10^{-6}\ \Omega^{-1}\text{-cm}^{-1}$ to about $10^6\ \Omega^{-1}\text{-cm}^{-1}$.

15. The composite superconducting material of claim 1, wherein the first electrically conducting material has a conductivity of about $10^{-5}\ \Omega^{-1}\text{-cm}^{-1}$ to about $10^5\ \Omega^{-1}\text{-cm}^{-1}$.

16. The composite superconducting material of claim 1, wherein the first electrically conducting material has a conductivity of about $10^{-4}\ \Omega^{-1}\text{-cm}^{-1}$ to about $10^4\ \Omega^{-1}\text{-cm}^{-1}$.

17. The composite superconducting material of claim 1, wherein the charge carriers are electrons.

18. The composite superconducting material of claim 1, wherein the charge carriers are holes.

19. The composite superconducting material of claim 1, wherein the first electrically conducting material has a two-dimensional thickness of less than the Debye screening length.

20. A method of forming the composite superconducting material of claim 1, the method comprising combining the first electrically conductive material and the first electrically polarizable ferroelectric material by powder mixture, melt forming, sputtering, atomic layer deposition, physical vapor deposition, electroplating, chemical vapor deposition, or co-sintering.

21. The method of claim 20, wherein the method forms the composite superconducting material to comprise at least one layer formed of the first electrically conductive material contacting at least one layer of the first electrically polarizable ferroelectric material.

22. The method of claim 20, wherein the method forms the composite superconducting material to comprise at least one layer formed of the first electrically conductive material between and contacting at least two layers of the first electrically polarizable ferroelectric material.

23. The method of claim 20, wherein the method forms the composite superconducting material to comprise a mixture of the first electrically conductive material and the first electrically polarizable ferroelectric material.

24. The method of claim 23, wherein filaments of the first electrically polarizable ferroelectric material are distributed and embedded in a matrix of the first electrically conductive material.

25. The method of claim 23, wherein inclusions of the first electrically polarizable ferroelectric material are distributed and embedded in a matrix of the first electrically conductive material.

* * * * *